(12) United States Patent
Choi

(10) Patent No.: US 7,772,082 B2
(45) Date of Patent: Aug. 10, 2010

(54) CAPACITOR OF SEMICONDUCTOR DEVICE AND METHOD OF FABRICATING THE SAME

(75) Inventor: Joong Il Choi, Icheon-si (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 197 days.

(21) Appl. No.: 11/987,989

(22) Filed: Dec. 6, 2007

(65) Prior Publication Data

US 2008/0261373 A1 Oct. 23, 2008

(30) Foreign Application Priority Data

Apr. 20, 2007 (KR) .................... 10-2007-0038907

(51) Int. Cl.
H01L 21/20 (2006.01)
(52) U.S. Cl. .................... 438/397; 438/253
(58) Field of Classification Search .......... 438/397, 438/253
See application file for complete search history.

(56) References Cited

U.S. PATENT DOCUMENTS 6,573,030 B1 * 6/2003 Fairbairn et al. ............ 430/323
7,262,453 B2 * 8/2007 Joo ............................ 257/303
2004/0048475 A1 3/2004 Hong et al.

FOREIGN PATENT DOCUMENTS

| KR | 1020050090831 A | 9/2005 |
| KR | 1020050117879 A | 12/2005 |
| KR | 1020060030820 A | 4/2006 |
| KR | 1020060071548 * | 7/2006 .................. 438/386 |

OTHER PUBLICATIONS

Notice of Allowance issued from Korean Intellectual Property Office on Sep. 30, 2009 with an English Translation.

* cited by examiner

Primary Examiner—Thanh V Pham
Assistant Examiner—Caleb Henry
(74) Attorney, Agent, or Firm—IP & T Law Firm PLC

(57) ABSTRACT

A method of fabricating a semiconductor device includes forming a buffer insulating film over a semiconductor substrate including a conductive pattern. The buffer insulating film is etched using a storage node mask to form a buffer insulating pattern exposing the conductive pattern. The buffer insulating pattern defines a region wider than a storage node region. An etch stop film is formed over the conductive pattern and the buffer insulating pattern. An interlayer insulating film is formed over the etch stop film. The interlayer insulating film is etched using the storage node mask to expose the etch stop film. The exposed etch stop film is etched to form the storage node region exposing conductive pattern. A lower storage node is formed over the storage node region.

8 Claims, 7 Drawing Sheets

CAPACITOR OF SEMICONDUCTOR DEVICE AND METHOD OF FABRICATING THE SAME

This application is based upon and claims the benefit of priority to Korean Patent Application No. 10-2007-0038907, filed on Apr. 20, 2007, the entire contents of which are incorporated herein by reference.

TECHNICAL FIELD

The invention generally relates to a semiconductor device. More particularly, the invention relates to a method of fabricating a semiconductor device including a capacitor.

BACKGROUND

As a semiconductor device becomes smaller and more highly integrated, the memory capability is increased. However, the high integration of the device increases a chip area but decreases a cell area. The reduction of the cell area decreases an area of a cell capacitor. As a result, the read-out capability of the cell is reduced, the durability is degraded by soft errors of alpha particles, and a sensing margin of a sense amplifier is decreased. Therefore, a method for securing a sufficient capacitance in a limited cell region is required.

The capacitance refers to a capacity of charges stored in a capacitor. As a capacitance becomes larger, more information can be stored. The capacitance is represented by Equation 1.

$$C = \varepsilon \frac{A}{d} \qquad \text{Equation 1}$$

$\varepsilon$ is a dielectric constant determined by kinds of dielectric films disposed between two electrodes, d is a distance between the two electrodes, and A is an effective surface of the two electrodes. Referring to Equation 1, as $\varepsilon$ is larger, d is shorter between the two electrodes and A of the two electrodes is increased, the capacitance of the capacitor can be increased. The electrode structure of the capacitor is changed to have a three-dimensional type such as a concave structure and a cylinder structure, thereby increasing the effective area of the electrodes.

FIGS. 1a to 1e are cross-sectional views illustrating a conventional method of fabricating a semiconductor device. A buffer oxide film 110, an etch stop film 115, an interlayer insulating film 120 and a hard mask layer 130 are sequentially formed over a semiconductor substrate 100 including a storage node contact plug 105. A silicon oxynitride (SiON) film and a photoresist pattern (not shown) defining a storage node region are formed over hard mask layer 130. Buffer oxide film 110 plays a role of compensating non-uniformity of semiconductor substrate 100. Etch stop film 115 includes a nitride film having the etching selectivity over interlayer insulating film 120 to stop an etching process.

Referring to FIGS. 1b to 1d, a silicon oxide nitride film (not shown) and hard mask layer 130 are sequentially etched using photoresist pattern as a mask. The oxynitride film and the photoresist pattern are removed. Interlayer insulating film 120 is etched using hard mask layer 130 as an etching mask to form a storage node region 117 that exposes etch stop film 115. Exposed etch stop film 115 at the bottom of storage node region 117 and underlying buffer oxide film 110 are sequentially etched to expose storage node contact plug 105. A first conductive layer 150 is formed over semiconductor substrate 100 including storage node region 117.

Referring to FIG. 1e, first conductive layer 150 is planarized until interlayer insulating film 120 is exposed. A full dip-out process is performed to remove interlayer insulating film 120, thereby forming a cylinder-type lower storage node 152. In the dip-out process, a space margin is insufficient to cause a leaning phenomenon of lower storage node 152.

However, as a height of a capacitor electrode is increased, a thickness of the interlayer insulating film is increased. As a result, an etch depth is deepened when the interlayer insulating film is etched so that it is difficult to secure a lower line-width of the storage node region. Although the buffer oxide film and the etch stop film prevent a leaning phenomenon of the cylinder-type lower storage node, a sufficient depth is not secured to prevent the leaning of the capacitor.

SUMMARY

Embodiments of the invention are directed to a semiconductor device. According to one embodiment of the invention, the semiconductor device includes a buffer insulating pattern to define a region wider than a storage node region with a storage node mask. The semiconductor device includes a capacitor that secures a line-width of a lower part of a lower storage node to prevent a leaning phenomenon of the capacitor, thereby improving reliability of the device. Also, an aspect ratio of the capacitor is increased to secure capacitance of the capacitor, thereby improving characteristics of the device.

According to another embodiment of the invention, a method of fabricating a semiconductor device includes forming a buffer insulating film over a semiconductor substrate including a conductive pattern. The buffer insulating film is etched using a storage node mask to form a buffer insulating pattern exposing the conductive pattern. The buffer insulating pattern defines a region wider than a storage node region. An etch stop film is formed over the conductive pattern and the buffer insulating pattern. An interlayer insulating film is formed over the etch stop film. The interlayer insulating film is etched using the storage node mask to expose the etch stop film. The exposed etch stop film is removed to expose the conductive pattern on the bottom and both sidewalls of the buffer insulating pattern, thereby forming a storage node region. A lining lower storage node is formed over the storage node region.

DETAILED DESCRIPTION

Figure 1A:
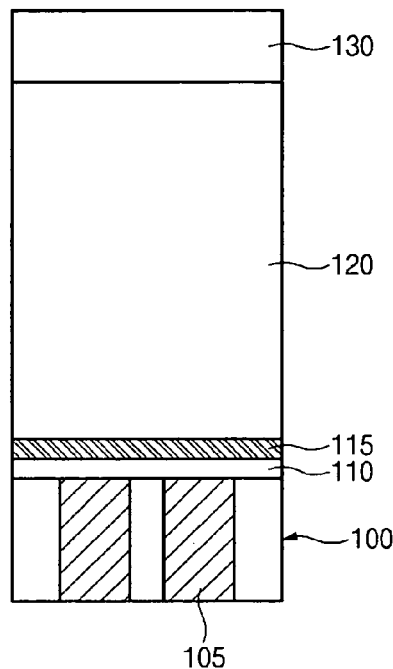
FIGS. 1a to 1e are cross-sectional views illustrating a conventional method of fabricating a semiconductor device.
Figure 1B:
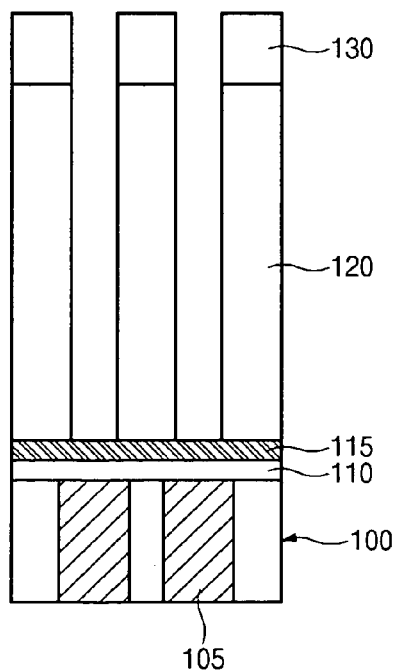
Figure 1C:
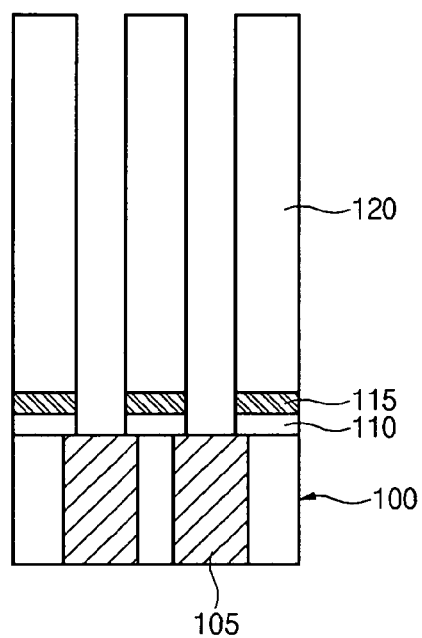
Figure 1D:
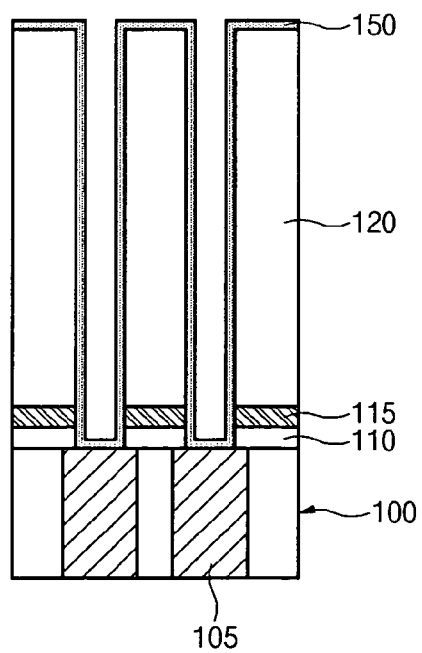
Figure 1E:
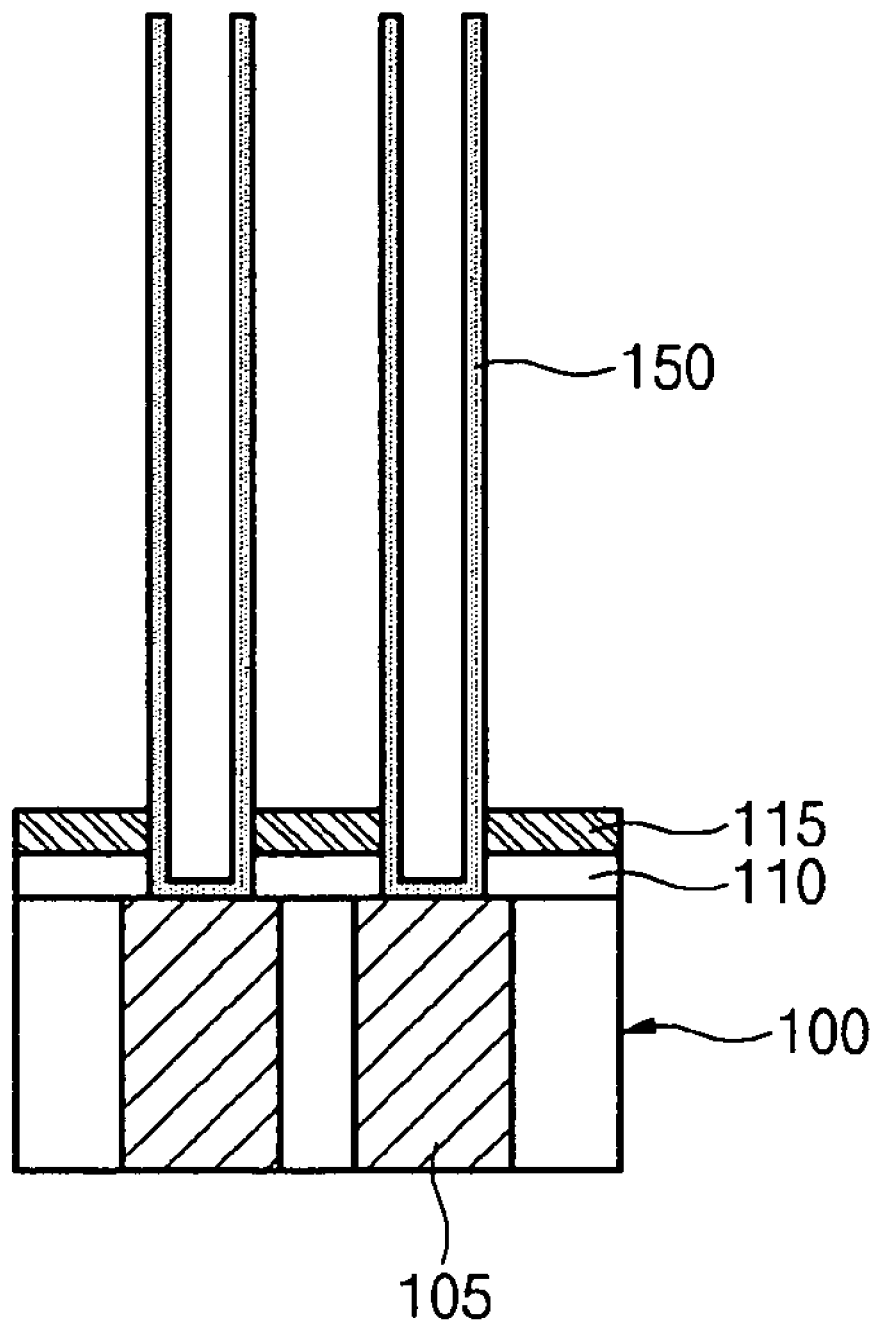

The invention relates to a method of fabricating a semiconductor device. In one embodiment of the invention, a buffer insulating pattern defining a region wider than a storage node region is formed using a storage node mask so as to obtain a capacitor.

FIGS. 2a to 2h are cross-sectional views illustrating a method of fabricating a semiconductor device according to an embodiment of the invention. A buffer insulating film 206 is formed over a semiconductor substrate 200 including a storage node contact plug 205. Buffer insulating film 206 includes an oxide film. Buffer insulating film 206 has a thickness in a range of about 1,000 Å to about 2,000 Å.

A photoresist film (not shown) is formed over buffer oxide film 206. The photoresist film is exposed and developed using a storage node mask to form a first photoresist pattern 208. First photoresist pattern 207 is over-exposed to define a region wider than a storage node region defined in the exposure mask. Buffer insulating film 206 is etched using first photoresist pattern 208 as a mask to form a buffer insulating pattern 210 that exposes storage node contact plug 205. First photoresist pattern 208 is removed.

Figure 2A:
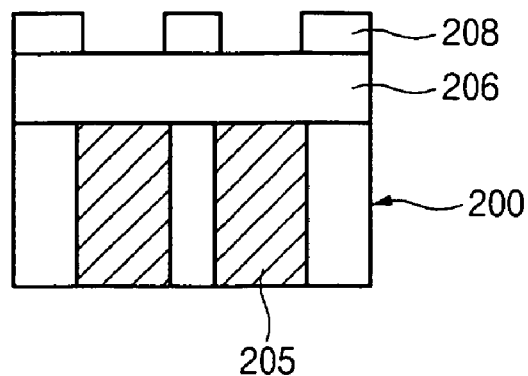
FIGS. 2a to 2h are cross-sectional views illustrating a method of fabricating a semiconductor device according to an embodiment of the invention.
Figure 2B:
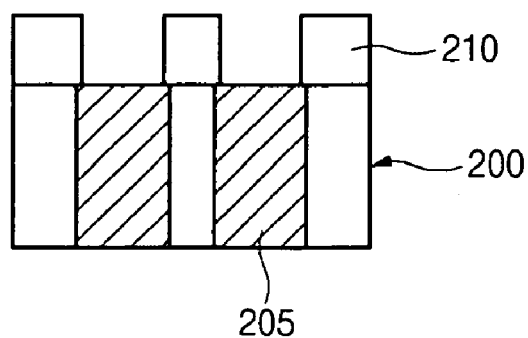
Figure 2C:
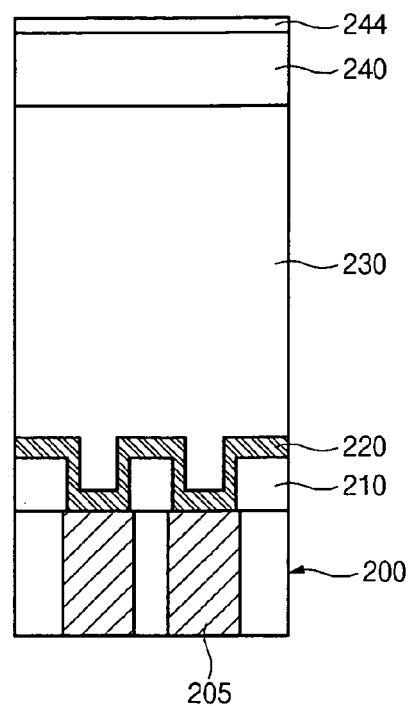

Referring to FIG. 2c, an etch stop film 220 is formed over storage node contact plug 205 and buffer insulating film 210. Etch stop film 220 has the etching selectivity over a subsequent interlayer insulating film. For example, etch stop film 220 includes a nitride film.

Interlayer insulating film 230 and hard mask layer 240 are formed over etch stop film 220. Interlayer insulating film 230 is selected from the group consisting of a phosphorous-silicate-glass ("PSG") oxide film, a plasma enhanced tetra-ethyl-ortho-silicate glass ("PE-TEOS") oxide film and a combination thereof. A thickness of interlayer insulating film 230 is adjusted depending on a height of the lower storage node. Hard mask layer 240 includes a carbon layer. A silicon oxynitride (SiON) film 244 is formed over hard mask layer 240.

Figure 2D:
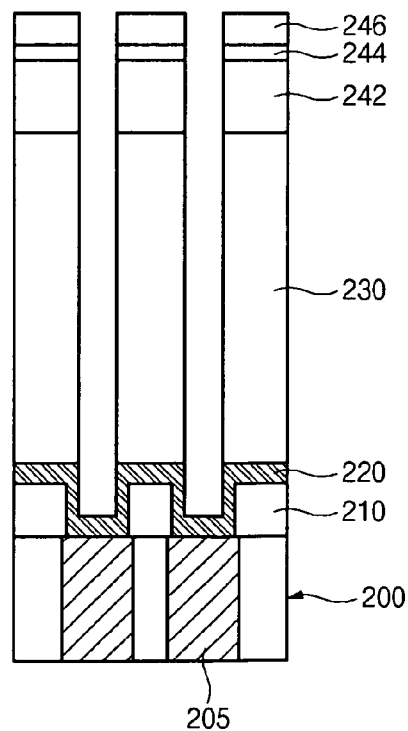

Referring to FIG. 2d, a photoresist film is formed over silicon oxynitride film 244. The photoresist film is exposed and developed using the storage node mask to form a second photoresist pattern 246 that defines a storage node region. The storage node mask is the same as the mask used when buffer insulating pattern 210 is formed. Silicon oxynitride film 244 and hard mask layer 240 are etched using second photoresist pattern 246 as an etching mask to form a hard mask pattern 242. Interlayer insulating film 230 is etched using hard mask pattern 242 as a mask to expose etch stop film 220. Second photoresist pattern 246 is removed.

Figure 2E:
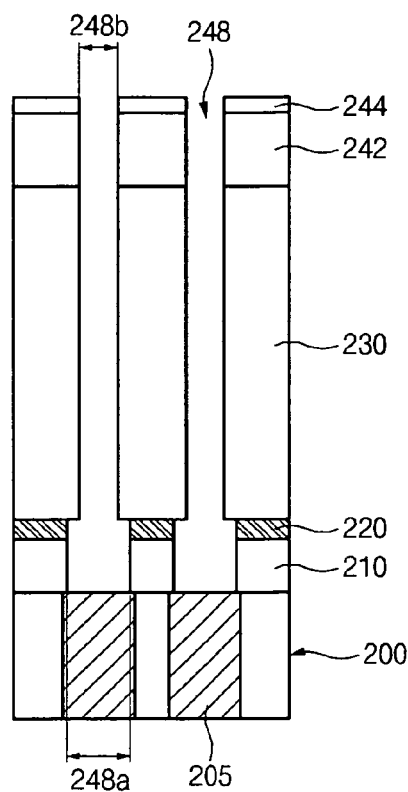
Figure 2F:
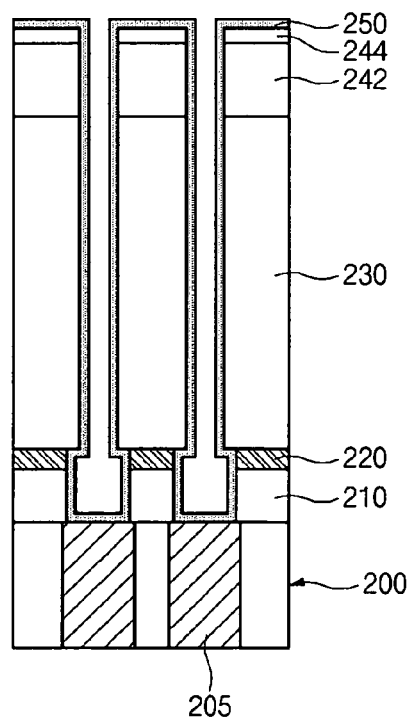
Figure 2G:
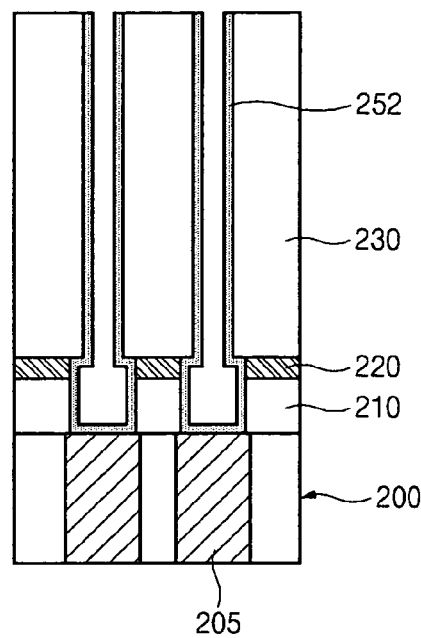

Referring to FIGS. 2e to 2g, exposed etch stop film 220 is removed to form a storage node region 248 that exposes the storage node contact plug 205. A selective etching method is performed with an etching selectivity difference between interlayer insulating film 230 and etch stop film 220 to remove etch stop film 220. In a lower part of the storage node region 248, etch stop film 220 formed over a sidewall of buffer insulating film 210 is removed. A line-width 248a of the lower part of storage node region 248 is wider than a line-width 248b of an upper part of storage node region 248. As a result, a subsequent lower storage node is substantially supported from the lower part of storage node region 248.

A conductive layer 250 is formed over storage node contact plug 205 including storage node region 248, buffer insulating pattern 210, interlayer insulating film 230, hard mask pattern 242 and silicon oxynitride film 244. Conductive layer 250 is selected from the group consisting of a titanium layer, a titanium nitride film and a combination thereof. A planarization process is performed on conductive layer 250 to expose interlayer insulating film 230, thereby isolating lower storage node 252.

Figure 2H:
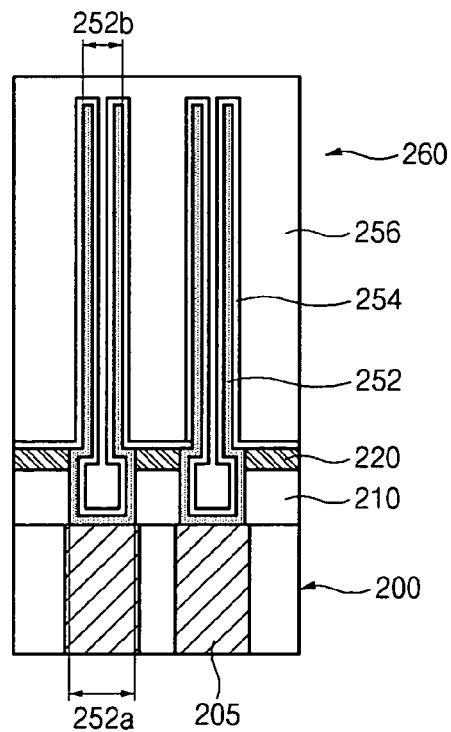

Referring to FIG. 2h, a full dip-out process is performed to remove interlayer insulating film 230, thereby exposing cylinder-type lower storage node 252. A bottom of lower storage node 252 is supported by buffer insulating pattern 210. Line-width 252a of a lower part of lower storage node 252 is wider than line-width 252b of an upper part of lower storage node 252, which prevents a leaning phenomenon of lower storage node 252 during the dip-out process. A dielectric layer 254 and a plate electrode 256 are formed over lower storage node 252 to obtain a capacitor 260.

As described above, according to an embodiment of the invention, a sufficient lower line-width of a lower storage node region is secured to obtain a solid lower storage node, thereby preventing a leaning phenomenon of the lower storage node.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a capacitor of a semiconductor device, the method comprising:
    forming a buffer insulating film over a semiconductor substrate including conductive patterns;
    etching the buffer insulating film using a storage node mask to form a buffer insulating pattern exposing one of the conductive patterns, the buffer insulating pattern defining a first storage node region wider than a second storage node region;
    forming an etch stop film over the conductive patterns and the buffer insulating pattern;
    forming an interlayer insulating film over the etch stop film;
    etching the interlayer insulating film using the storage node mask to expose the etch stop film thereby forming the second storage node region;
    removing the exposed etch stop film to expose the conductive patterns on the bottom and both sidewalls of the buffer insulating pattern, thereby forming the first storage node region; and
    forming a lining lower storage node over the first and second storage node regions.

2. The method of claim 1, wherein the process of forming the buffer insulating pattern comprises:
    forming a photoresist film over the buffer insulating film;
    exposing and developing the photoresist film using the storage node mask to form a photoresist pattern;
    etching the buffer insulating film using the photoresist pattern to form the buffer insulating pattern; and
    removing the photoresist pattern.

3. The method of claim 2, wherein the exposing process is performed using an over-exposing method to form the photoresist pattern defining a wider width than that of the second storage node region.

4. The method of claim 1, wherein the interlayer insulating film is selected from the group consisting of a phosphorous-silicate-glass (PSG) oxide film, a plasma enhanced tetra-ethyl-ortho-silicate glass (PE-TEOS) oxide film, and a combination thereof.

5. The method of claim 1, further comprising forming a hard mask carbon layer and a silicon oxynitride film over the interlayer insulating film.

6. The method of claim 1, wherein the buffer insulating film is formed to have a thickness in a range of about 1,000 to 2,000 Å.

7. The method of claim 1, wherein conductive patterns are storage node contact plugs.

8. The method of claim 1, wherein a line-width of the first storage node region is wider than a line-width of the second storage node region.

* * * * *